(12) United States Patent
Wu

(10) Patent No.: US 12,201,000 B2
(45) Date of Patent: Jan. 14, 2025

(54) DISPLAY PANEL AND DISPLAY DEVICE WITH HIGH BT2020 COLOR GAMUT COVERAGE

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Kailong Wu, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 17/434,027

(22) PCT Filed: Jul. 22, 2021

(86) PCT No.: PCT/CN2021/107960
§ 371 (c)(1),
(2) Date: Aug. 26, 2021

(87) PCT Pub. No.: WO2023/272819
PCT Pub. Date: Jan. 5, 2023

(65) Prior Publication Data
US 2024/0023402 A1    Jan. 18, 2024

(30) Foreign Application Priority Data
Jul. 2, 2021    (CN) .......................... 202110748056.5

(51) Int. Cl.
*H10K 59/38*    (2023.01)
*H10K 59/80*    (2023.01)

(52) U.S. Cl.
CPC ......... *H10K 59/38* (2023.02); *H10K 59/8792* (2023.02)

(58) Field of Classification Search
None
See application file for complete search history.

(56) References Cited

U.S. PATENT DOCUMENTS

2008/0224595 A1* 9/2008 Nakamata ............ H10K 50/852
313/500
2012/0069277 A1    3/2012 Wang et al.
(Continued)

FOREIGN PATENT DOCUMENTS

CN    110335883    10/2009
CN    110021644    7/2019
(Continued)

OTHER PUBLICATIONS

International Search Report and the Written Opinion Dated Mar. 28, 2022 From the International Searching Authority Re. Application No. PCT/CN2021/107960 and Its Translation Into English. (15 Pages).
(Continued)

*Primary Examiner* — Nduka E Ojeh

(57) ABSTRACT

The present disclosure relates to a display panel and a display device. The display panel includes a substrate, a light-emitting layer, an encapsulation layer, and a light-filtering layer. The light-filtering layer is used to filter and adjust light emitted by the light-emitting layer to improve luminous purity of a red light-emitting unit and a green light-emitting unit, thereby adjusting the light emitted by the light-emitting layer of the display panel to R (0.708, 0.292), G (0.170, 0.797), and B (0.131, 0.046), thereby effectively achieving high BT2020 color gamut coverage and improving the color display capability of the display panel.

17 Claims, 3 Drawing Sheets

(56) References Cited

U.S. PATENT DOCUMENTS

| | | | |
|---|---|---|---|
| 2017/0138562 A1* | 5/2017 | Western | F21K 9/272 |
| 2017/0186819 A1* | 6/2017 | Yun | H10K 59/38 |
| 2020/0119101 A1* | 4/2020 | Lee | H10K 59/38 |
| 2020/0264461 A1* | 8/2020 | Kuwana | G02F 1/1336 |
| 2020/0395574 A1* | 12/2020 | Lee | H10K 50/844 |
| 2022/0052129 A1* | 2/2022 | Kim | G01S 17/04 |
| 2023/0051958 A1* | 2/2023 | Seong | H01L 33/505 |
| 2023/0075283 A1* | 3/2023 | Imaizumi | H10K 85/624 |
| 2023/0078029 A1* | 3/2023 | Uno | C07D 307/91 |
| | | | 257/40 |

FOREIGN PATENT DOCUMENTS

| | | |
|---|---|---|
| CN | 110504288 | 11/2019 |
| KR | 10-2013-0020379 | 2/2013 |
| TW | 201130849 | 9/2011 |
| WO | WO 2021/027516 | 2/2021 |

OTHER PUBLICATIONS

Notification of Office Action Dated Apr. 16, 2023 From The State Intellectual Property Office of the People's Republic of China Re. Application No. 202110748056.5 and Its Translation Into English. (10 Pages).

\* cited by examiner

DISPLAY PANEL AND DISPLAY DEVICE WITH HIGH BT2020 COLOR GAMUT COVERAGE

RELATED APPLICATIONS

This application is a National Phase of PCT Patent Application No. PCT/CN2021/107960 having International filing date of Jul. 22, 2021, which claims the benefit of priority of Chinese Patent Application No. 202110748056.5 filed on Jul. 2, 2021. The contents of the above applications are all incorporated by reference as if fully set forth herein in their entirety.

FIELD AND BACKGROUND OF THE INVENTION

The present disclosure relates to the field of display, in particular, to a display panel and a display device.

With development of display technology, users' pursuit on display effects of display devices has gradually increased. In recent years, organic light-emitting display diodes (OLED) have developed rapidly in the world. OLED with advantages, such as low voltage requirements, high power-saving efficiency, fast response, less weight, thin thickness, simple structure, low cost, wide viewing angle, almost infinitely high contrast, low power consumption, and extremely high response speed, has become one of the most important display technologies today.

SUMMARY OF THE INVENTION

With the advent of ultra-high-resolution displays such as 4K and 8K, users have further improved their color performance requirements. A standard definition of a color gamut is a method of encoding a color and refers to a summation of colors that a technical system can produce. DCI-P3 is a higher color gamut specification currently in use. Although a color gamut specification of BT2020 is a higher-level specification, three primary colors of BT2020 are too saturated, and it is difficult for general devices to achieve. Therefore, the color gamut specification of BT2020 is also more difficult to implement. Currently, coverage rate of BT2020 for the products of major screen manufacturers and terminal manufacturers is less than 80%.

An object of the present disclosure is to provide a display panel and a display device, which can solve problems of difficulty in realizing the existing BT2020 color gamut specification and low coverage rate of BT2020.

In order to solve the above problems, the present disclosure provides a display panel, which includes a substrate; a light-emitting layer disposed on a surface of one side of the substrate; an encapsulation layer is disposed on a surface of one side of the light-emitting layer away from the substrate; and a light-filtering layer disposed on a surface of one side of the encapsulation layer away from the substrate; wherein the light-emitting layer includes a first light-emitting unit, a second light-emitting unit, and a third light-emitting unit that are spaced apart from each other; wherein the light-filtering layer includes a first light-filtering unit and a second light-filtering unit that are spaced apart from each other; the first light-filtering unit is disposed opposite to the first light-emitting unit; the second light-filtering unit is disposed opposite to the second light-emitting unit; and wherein a light-filtered wavelength of the first light-filtering unit is less than 630 nm, and a light-filtered wavelength of the second light-filtering unit is greater than 530 nm.

Further, the light-filtering layer further includes a planarization unit disposed opposite to the third light-emitting unit, wherein the planarization unit is spaced apart from the first light-filtering unit and the second light-filtering unit.

Further, the light-filtering layer further includes a plurality of black barrier units disposed on the encapsulation layer between the first light-filtering unit, the second light-filtering unit, and the planarization unit.

Further, the first light-emitting unit is a red light-emitting unit, and a material of the first light-filtering unit is red dye; and the second light-emitting unit is a green light-emitting unit, and a material of the second light-filtering unit is green dye.

Further, the red dye includes one or more of rhodamine-based red dye, anthraquinone-based polymer resin red dye, or iron oxide red dye.

Further, the green dye includes one or more of malachite green dye, phthalocyanine green dye, or azo green dye.

Further, a material of the planarization unit is a transparent light-transmitting material.

Further, a projection area of the first light-emitting unit on the substrate locates within a projection area of the first light-filtering unit on the substrate; and a projection area of the second light-emitting unit on the substrate locates within a projection area of the second light-filtering unit on the substrate.

Further, the encapsulation layer includes a first inorganic layer disposed on a surface of one side of the light-emitting layer away from the substrate; an organic layer disposed on a surface of one side of the first inorganic layer away from the substrate; and a second inorganic layer disposed on a surface of one side of the organic layer away from the substrate.

In order to solve the above-mentioned problems, the present disclosure also provides a display device, which includes the display panel involved in the present disclosure.

The present disclosure relates to a display panel and a display device. A light-filtering layer is provided on a light-emitting layer. The light-filtering layer is used to filter and adjust light emitted by the light-emitting layer, thereby improving luminous purity of the red light-emitting unit and the green light-emitting unit, thereby adjusting the light emitted by the light-emitting layer of the display panel to R (0.708, 0.292), G (0.170, 0.797), and B (0.131, 0.046), thereby effectively achieving high BT2020 color gamut coverage and finally improving color display capability of the display panel.

BRIEF DESCRIPTION OF THE SEVERAL VIEWS OF THE DRAWINGS

To more clearly describe the technical solutions in the embodiments of the present disclosure, the drawings needed in the description of the embodiments will be introduced as follows. Obviously, the drawings in the following description are only some embodiments of the present disclosure. Other drawings can be obtained by those skilled in the art based on these drawings without creative work.

Figure 1:
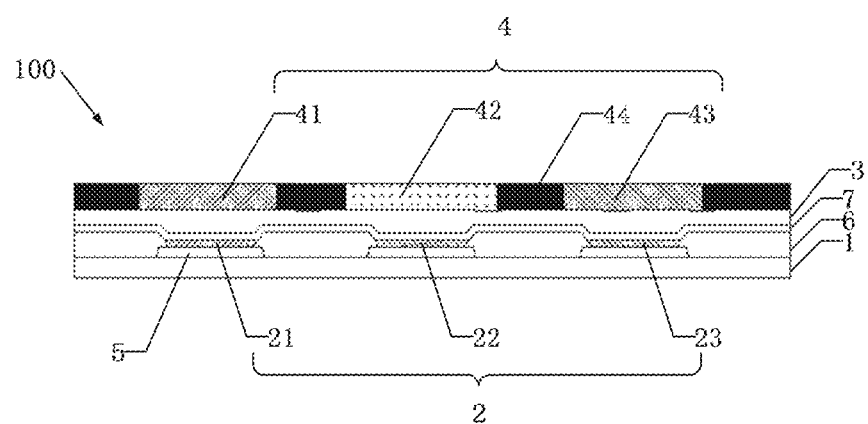
FIG. 1 is a schematic structure diagram of a display panel of the present disclosure.

Description of reference signs:

| | |
|---|---|
| 100: display panel; | |
| 1: substrate; | 2: light-emitting layer; |
| 3: encapsulation layer; | 4: light-filtering layer; |
| 5: anode; | 6: pixel barrier layer; |
| 7: cathode; | |
| 21: first light-emitting unit; | 22: second light-emitting unit; |
| 23: third light-emitting unit; | |
| 31: first inorganic layer; | 32: organic layer; |
| 33: second inorganic layer; | |
| 41: first light-filtering unit; | 42: second light-filtering unit; |
| 43: planarization unit; | 44. black barrier unit. |

DESCRIPTION OF SPECIFIC EMBODIMENTS OF THE INVENTION

Hereinafter, the preferred embodiments of the present disclosure will be described in detail with reference to the accompanying drawings of the specification to fully introduce the technical content of the present disclosure to those skilled in the art to demonstrate that the present disclosure can be implemented by using examples, so that the technical content disclosed by the present disclosure is clearer. Those skilled in the art can easily understand how to implement the present disclosure. However, the present disclosure can be embodied in many different forms of embodiments, and the protection scope of the present disclosure is not limited to the embodiments mentioned in the text. The description of the following embodiments is not intended to limit the scope of the present disclosure.

The directional terms mentioned in the present invention, such as "up," "down," "front," "rear," "left," "right," "inner," "outer," and "side," are only used to present directions in the drawings, The directional terms herein are used to explain and describe the present disclosure and do not limit the protection scope of the present disclosure.

In the drawings, components with the same structure are denoted by the same reference signs, and components with similar structures or functions are denoted by similar reference signs. In addition, for ease of understanding and description, the size and thickness of each component shown in the drawings are arbitrarily shown. The present disclosure does not limit the size and thickness of each component.

Figure 2:
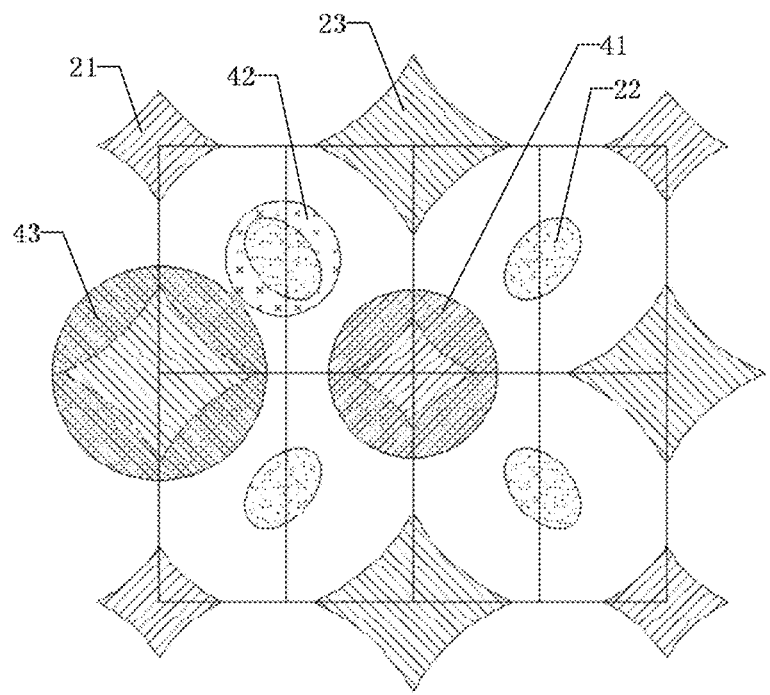
FIG. 2 is a schematic plan view of a light-emitting layer covered by a light-filtering layer of the display panel of the present disclosure.

As shown in FIGS. 1 and 2, this embodiment provides a display device, and the display device includes a display panel 100. The display panel 100 includes a substrate 1, a light-emitting layer 2, an encapsulation layer 3, and a light-filtering layer 4.

The substrate 1 may be a flexible substrate, so that the substrate 1 can have better impact resistance and can effectively protect the display panel 100. Material of the substrate 1 includes one or more of silicon dioxide, polyester resin, polyethylene, polypropylene, polystyrene, polylactic acid, polyethylene terephthalate, polyimide, or polyurethane.

In fact, the display panel 100 further includes a thin film transistor layer (not shown), and the thin film transistor layer is disposed on one side of the substrate 1 facing the light-emitting layer 2. Specifically, the thin film transistor layer may include a gate layer, a gate insulation layer, an active layer, a source and drain layer, and other film layers, which will not be repeated here. The source and drain layer is electrically connected to the active layer. The thin film transistor layer may adopt a top-gated structure or a bottom-gated structure, which is not limited in this embodiment.

As shown in FIG. 1, the display panel 100 further includes a plurality of anodes 5. The plurality of anodes 5 are spaced apart from each other on a surface of one side of the substrate. Specifically, the thin film transistor layer is disposed between the substrate and the plurality of anodes 5. Because nano indium tin metal oxide (ITO) has good conductivity and light transmittance, the material of the plurality of anodes 5 in this embodiment is preferably ITO. In other embodiments, the material of the plurality of anodes 5 can also be other materials.

As shown in FIG. 1, the display panel further includes a pixel barrier layer 6, and the pixel barrier layer 6 is disposed on the substrate 1 between two adjacent anodes 5. The pixel barrier layer 6 is mainly used to prevent light crosstalk phenomenon between adjacent light-emitting units.

As shown in FIG. 1, the light-emitting layer 2 is provided on a surface of one side of the substrate 1. Specifically, the light-emitting layer 2 is disposed on a surface of one side of the anode 5 away from the substrate 1. Material of the light-emitting layer 2 includes organic electroluminescent material.

As shown in FIGS. 1 and 2, the light-emitting layer 2 includes a first light-emitting unit 21, a second light-emitting unit 22 and a third light-emitting unit 23 spaced apart from each other. In this embodiment, the first light-emitting unit 21 is a red light-emitting unit, the second light-emitting unit 22 is a green light-emitting unit, and the third light-emitting unit 23 is a blue light-emitting unit.

As shown in FIG. 1, the display panel 100 further includes a cathode 7. The cathode 7 covers a surface of one side of the light-emitting layer 2 away from the substrate 1. Because nano indium tin metal oxide (ITO) has good conductivity and light transmittance, the material of the cathode 7 in this embodiment is preferably ITO. In other embodiments, the material of the cathode 7 can also be other materials.

In fact, the display panel 100 may also include a hole injection layer (not shown), an electron blocking layer (not shown), a hole blocking layer (not shown), an electron injection layer (not shown), etc., which are not repeated here.

As shown in FIG. 1, the encapsulation layer 3 is disposed on a surface of one side of the light-emitting layer 2 away from the substrate 1.

Figure 3:
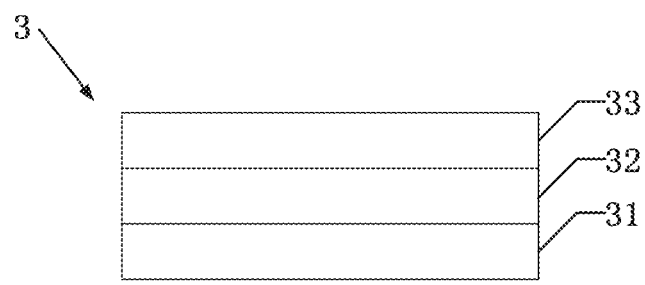
FIG. 3 is a schematic structure diagram of an encapsulation layer of the present disclosure.

As shown in FIG. 3, the encapsulation layer 3 may include a first inorganic layer 31, an organic layer 32, and a second inorganic layer 33. The first inorganic layer 31 is disposed on a surface of one side of the light-emitting layer 2 away from the substrate 1. The organic layer 32 is disposed on a surface of one side of the first inorganic layer 31 away from the substrate 1. The second inorganic layer 33 is disposed on a surface of one side of the organic layer 32 away from the substrate 1. The first inorganic layer 31 and the second inorganic layer 33 mainly play a role of blocking water and oxygen. In addition, the organic layer 32 mainly buffers and releases the stress on the encapsulation layer 3 to increase the bendability of the display panel 100.

As shown in FIG. 1, the light-filtering layer 4 is disposed on a surface of one side of the encapsulation layer 3 away from the substrate 1.

As shown in FIGS. 1 and 2, the light-filtering layer 4 includes a first light-filtering unit 41, a second light-filtering unit 42, and a planarization unit 43 that are spaced apart from each other.

As shown in FIGS. 1 and 2, the first light-filtering unit 41 is disposed opposite to the first light-emitting unit 21. Specifically, a projection area of the first light-emitting unit 21 on the substrate 1 locates within a projection area of the first light-filtering unit 41 on the substrate 1.

Figure 4:
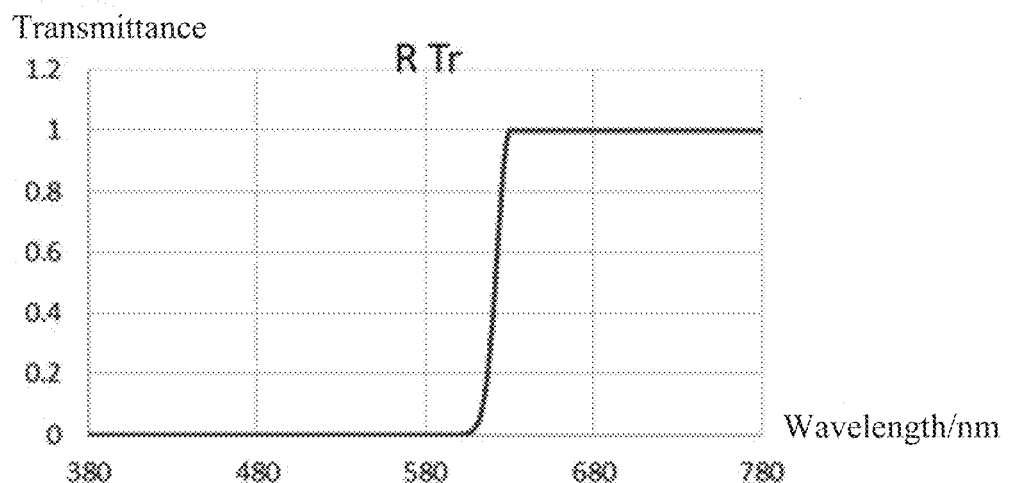
FIG. 4 is a schematic transmittance diagram of a first light-filtering unit of the light-filtering layer of the present disclosure.

As shown in FIG. 4, because the first light-emitting unit 21 is a red light-emitting unit, in order to improve purity of light emitted by the first light-emitting unit 21, a light-filtered wavelength of the first light-filtering unit 41 is less than 630 nm, that is, the first light-filtering unit 41 absorbs and filters light with a wavelength less than 630 nm.

Material of the first light-filtering unit 41 is red dye. The red dye includes one or more of rhodamine-based red dye, anthraquinone-based polymer resin red dye, or iron oxide red dye.

As shown in FIGS. 1 and 2, the second light-filtering unit 42 is disposed opposite to the second light-emitting unit 22. Specifically, a projection area of the second light-emitting unit 22 on the substrate 1 locates within a projection area of the second light-filtering unit 42 on the substrate 1.

Figure 5:
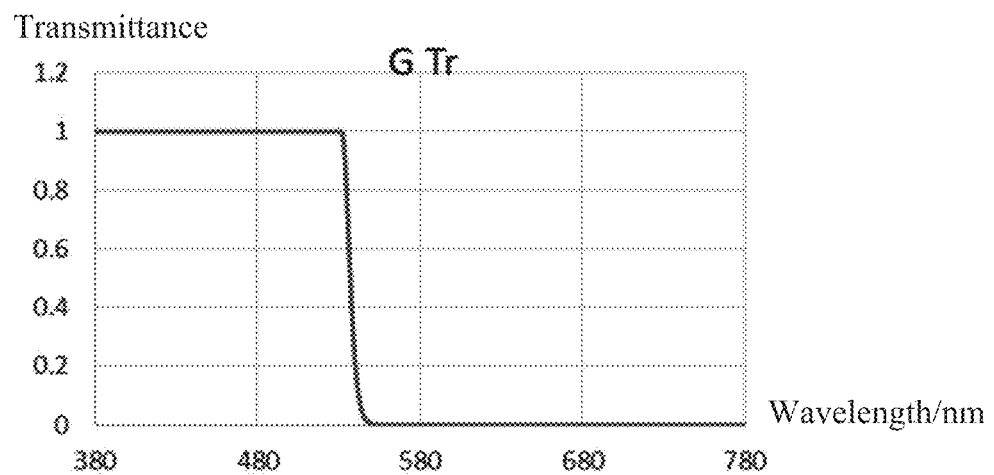
FIG. 5 is a schematic transmittance diagram of a second light-filtering unit of the light-filtering layer of the present disclosure.

As shown in FIG. 5, because the second light-emitting unit 22 is a green light-emitting unit, in order to improve purity of light emitted by the second light-emitting unit 22, a light-filtered wavelength of the second light-filtering unit 42 is greater than 530 nm, that is, the second light-filtering unit 42 absorbs and filters light with a wavelength greater than 530 nm.

The material of the second light-filtering unit 42 is green dye. The green dye includes one or more of malachite green dye, phthalocyanine green dye, or azo green dye.

As shown in FIGS. 1 and 2, the planarization unit 43 is disposed opposite to the third light-emitting unit 23. Because the third light-emitting unit 23 is a blue light-emitting unit, and light emitted by a current blue light-emitting unit basically meets the BT2020 color gamut requirements in terms of light color, this embodiment does not adjust light emitted from the third light-emitting unit 23. Material of the planarization unit 43 can be a transparent light-transmitting material. A surface of one side of the light-filtering layer 4 away from the substrate 1 can be a planar surface, and production costs of the display panel can avoid increasing.

As shown in FIG. 1, the filter layer 4 further includes a plurality of black barrier units 44. The plurality of black barrier units are disposed on the encapsulation layer 3 between the first light-filtering unit 41, the second light-filtering unit 42, and the flat unit 43. Each of the black barrier units 44 are mainly used to prevent light crosstalk phenomenon between adjacent light-emitting units.

Figure 6:
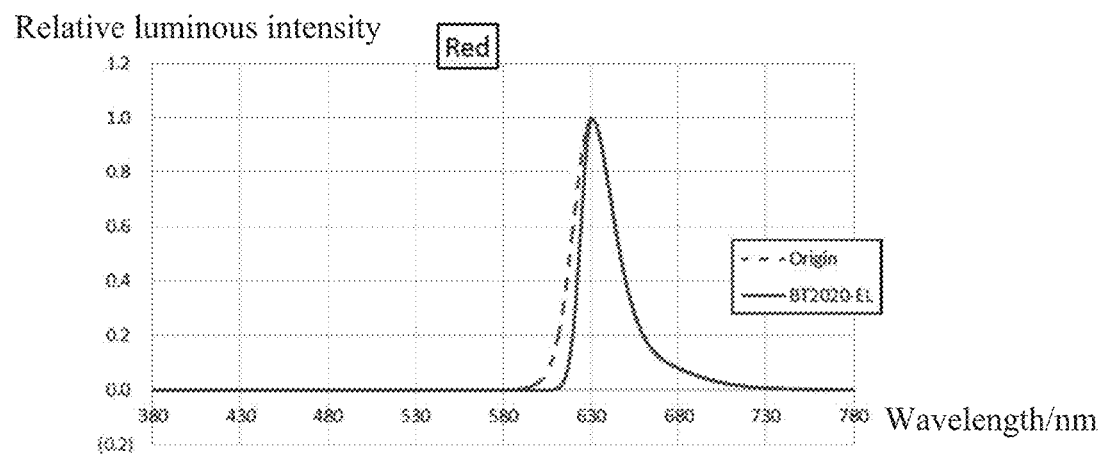
FIG. 6 is a schematic diagram of a comparison of spectra of light emitted by the first light-emitting unit before and after being adjusted by the first light-filtering unit of the present disclosure.
Figure 7:
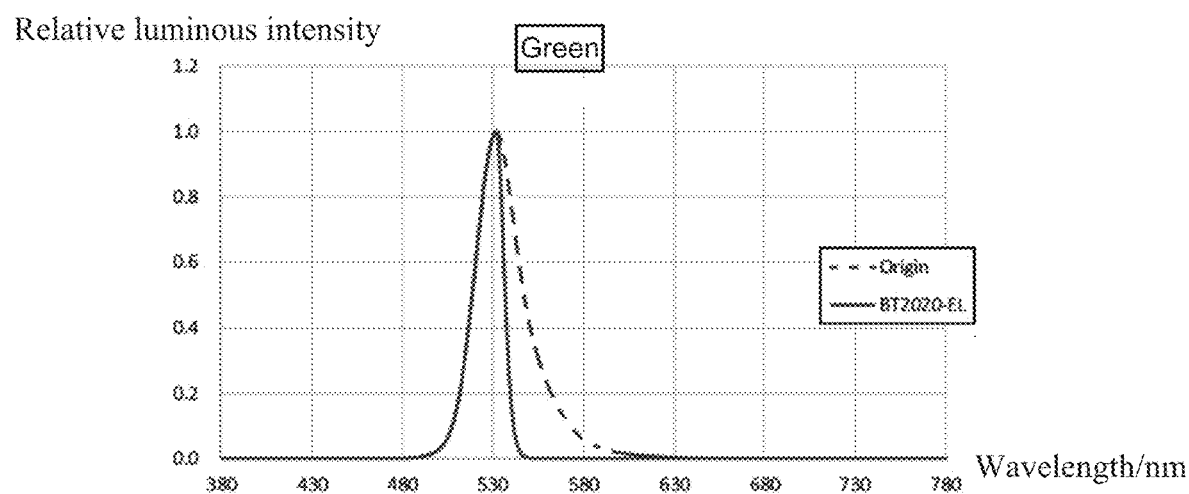
FIG. 7 is a schematic diagram of a comparison of spectra of light emitted by the second light-emitting unit before and after being adjusted by the second light-filtering unit of the present disclosure.

As shown in FIGS. 6 and 7, in this embodiment, the light-filtering layer 4 is provided on the light-emitting layer 2. The light-filtering layer 4 is used to filter and adjust light emitted by the light-emitting layer 2, thereby improving luminous purity of the red light-emitting unit and the green light-emitting unit, thereby adjusting the light emitted by the light-emitting layer 2 of the display panel 100 to R (0.708, 0.292), G (0.170, 0.797), and B (0.131, 0.046), thereby effectively achieving high BT2020 color gamut coverage and finally improving color display capability of the display panel 100.

The above description is a detailed introduction to a display panel and a display device provided by the present disclosure. Herein, specific examples are used to illustrate the principles and implementations of the present disclosure. The description of the above embodiments is only used to help understand the methods and core ideas of the present disclosure. At the same time, according to the ideas of the present disclosure, for those skilled in the art, there will be changes in the specific implementation and scope of application. In summary, the content of the present disclosure should not be understood as a limitation to the present disclosure.

What is claimed is:

1. A display panel, comprising:
    a substrate;
    a light-emitting layer disposed on a surface of one side of the substrate;
    an encapsulation layer is disposed on a surface of one side of the light-emitting layer away from the substrate; and
    a light-filtering layer directly disposed on a surface of one side of the encapsulation layer away from the substrate;
    wherein the light-emitting layer comprises a first light-emitting unit, a second light-emitting unit, and a third light-emitting unit that are spaced apart from each other;
    wherein the light-filtering layer comprises a first light-filtering unit and a second light-filtering unit that are spaced apart from each other; the first light-filtering unit is disposed opposite to the first light-emitting unit; the second light-filtering unit is disposed opposite to the second light-emitting unit; and
    wherein a light-filtered wavelength of the first light-filtering unit is less than 630 nm, and a light-filtered wavelength of the second light-filtering unit is greater than 530 nm;
    the first light-emitting unit is a red light-emitting unit, and the second light-emitting unit is a green light-emitting unit;
    wherein the light-filtering layer further comprises:
    a plurality of black barrier units disposed on the encapsulation layer between the first light-filtering unit, the second light-filtering unit, and the planarization unit.

2. The display panel as claimed in claim 1, wherein the light-filtering layer further comprises:
    a planarization unit disposed opposite to the third light-emitting unit, wherein the planarization unit is spaced apart from the first light-filtering unit and the second light-filtering unit.

3. The display panel as claimed in claim 2, wherein a material of the planarization unit is a transparent light-transmitting material.

4. The display panel as claimed in claim 1, wherein a material of the first light-filtering unit is red dye; and a material of the second light-filtering unit is green dye.

5. The display panel as claimed in claim 4, wherein the red dye comprises one or more of rhodamine-based red dye, anthraquinone-based polymer resin red dye, or iron oxide red dye.

6. The display panel as claimed in claim 4, wherein the green dye comprises one or more of malachite green dye, phthalocyanine green dye, or azo green dye.

7. The display panel as claimed in claim 1, wherein a projection area of the first light-emitting unit on the substrate locates within a projection area of the first light-filtering unit on the substrate; and a projection area of the second light-emitting unit on the substrate locates within a projection area of the second light-filtering unit on the substrate.

8. The display panel as claimed in claim 1, wherein the encapsulation layer comprises:
   a first inorganic layer disposed on a surface of one side of the light-emitting layer away from the substrate;
   an organic layer disposed on a surface of one side of the first inorganic layer away from the substrate; and
   a second inorganic layer disposed on a surface of one side of the organic layer away from the substrate.

9. A display device, comprising a display panel, wherein the display panel comprises:
   a substrate;
   a light-emitting layer disposed on a surface of one side of the substrate;
   an encapsulation layer is disposed on a surface of one side of the light-emitting layer away from the substrate; and
   a light-filtering layer directly disposed on a surface of one side of the encapsulation layer away from the substrate;
   wherein the light-emitting layer comprises a first light-emitting unit, a second light-emitting unit, and a third light-emitting unit that are spaced apart from each other;
   wherein the light-filtering layer comprises a first light-filtering unit and a second light-filtering unit that are spaced apart from each other; the first light-filtering unit is disposed opposite to the first light-emitting unit; the second light-filtering unit is disposed opposite to the second light-emitting unit; and
   wherein a light-filtered wavelength of the first light-filtering unit is less than 630 nm, and a light-filtered wavelength of the second light-filtering unit is greater than 530 nm;
   the first light-emitting unit is a red light-emitting unit, and the second light-emitting unit is a green light-emitting unit;
   wherein the light-filtering layer further comprises:
   a plurality of black barrier units disposed on the encapsulation layer between the first light-filtering unit, the second light-filtering unit, and the planarization unit.

10. The display device as claimed in claim 9, wherein the light-filtering layer further comprises:
    a planarization unit disposed opposite to the third light-emitting unit, wherein the planarization unit is spaced apart from the first light-filtering unit and the second light-filtering unit.

11. The display device as claimed in claim 10, wherein a material of the planarization unit is a transparent light-transmitting material.

12. The display panel as claimed in claim 9, wherein a material of the first light-filtering unit is red dye; and a material of the second light-filtering unit is green dye.

13. The display device as claimed in claim 12, wherein the red dye comprises one or more of rhodamine-based red dye, anthraquinone-based polymer resin red dye, or iron oxide red dye.

14. The display device as claimed in claim 12, wherein the green dye comprises one or more of malachite green dye, phthalocyanine green dye, or azo green dye.

15. The display device as claimed in claim 9, wherein a projection area of the first light-emitting unit on the substrate locates within a projection area of the first light-filtering unit on the substrate; and a projection area of the second light-emitting unit on the substrate locates within a projection area of the second light-filtering unit on the substrate.

16. The display device as claimed in claim 9, wherein the encapsulation layer comprises:
    a first inorganic layer disposed on a surface of one side of the light-emitting layer away from the substrate;
    an organic layer disposed on a surface of one side of the first inorganic layer away from the substrate; and
    a second inorganic layer disposed on a surface of one side of the organic layer away from the substrate.

17. A display panel, comprising:
    a substrate;
    a light-emitting layer disposed on a surface of one side of the substrate;
    an encapsulation layer is disposed on a surface of one side of the light-emitting layer away from the substrate; and
    a light-filtering layer directly disposed on a surface of one side of the encapsulation layer away from the substrate;
    wherein the light-emitting layer comprises a first light-emitting unit, a second light-emitting unit, and a third light-emitting unit that are spaced apart from each other;
    wherein the light-filtering layer comprises a first light-filtering unit and a second light-filtering unit that are spaced apart from each other; the first light-filtering unit is disposed opposite to the first light-emitting unit; the second light-filtering unit is disposed opposite to the second light-emitting unit; and
    wherein a light-filtered wavelength of the first light-filtering unit is less than 630 nm, and a light-filtered wavelength of the second light-filtering unit is greater than 530 nm;
    the first light-emitting unit is a red light-emitting unit, and the second light-emitting unit is a green light-emitting unit;
    wherein the encapsulation layer comprises:
    a first inorganic layer disposed on a surface of one side of the light-emitting layer away from the substrate;
    an organic layer disposed on a surface of one side of the first inorganic layer away from the substrate; and
    a second inorganic layer disposed on a surface of one side of the organic layer away from the substrate.

* * * * *